United States Patent [19]

Cornwell

[11] Patent Number: 5,255,207
[45] Date of Patent: Oct. 19, 1993

[54] METHOD FOR DESIGNING AND DETAILING CABINETS

[76] Inventor: Larry Cornwell, 4405 Manchester, Ste. 102, Encinitas, Calif. 92024

[21] Appl. No.: 900,560

[22] Filed: Jun. 18, 1992

Related U.S. Application Data

[63] Continuation of Ser. No. 449,501, Dec. 1, 1989, abandoned, which is a continuation of Ser. No. 207,725, Jun. 16, 1988, abandoned.

[51] Int. Cl.⁵ .................................................. G06F 15/60
[52] U.S. Cl. ...................................... 364/512; 364/401; 364/464.01; 364/505; 395/919
[58] Field of Search .................................. 395/919–923; 364/400, 401, 464.01, 468, 488, 505, 512, 514

[56] References Cited

U.S. PATENT DOCUMENTS

| | | | |
|---|---|---|---|
| 4,275,449 | 6/1981 | Aish | 364/518 |
| 4,428,056 | 1/1984 | Schroeder et al. | 364/518 |
| 4,549,275 | 10/1985 | Sukonick | 364/518 |
| 4,554,635 | 11/1985 | Levine | 364/512 X |
| 4,630,219 | 12/1986 | DiGiacomo et al. | 364/488 |
| 4,642,780 | 2/1987 | Thomson | 364/521 |
| 4,654,284 | 3/1987 | Watanabe et al. | 395/921 X |
| 4,685,070 | 8/1987 | Flinchbaugh | 364/522 |
| 4,700,317 | 10/1987 | Watanabe et al. | 364/521 |
| 4,747,074 | 5/1988 | Yoshida | 364/521 |
| 4,766,555 | 8/1988 | Bennett | 364/521 |
| 4,815,003 | 3/1989 | Putatunda et al. | 364/488 X |
| 4,868,766 | 9/1989 | Oosterholt | 364/522 |
| 4,882,692 | 11/1989 | Saxton et al. | 364/518 |
| 4,947,322 | 8/1990 | Tenma et al. | 364/401 |
| 4,949,275 | 4/1990 | Nonaka | 364/488 X |
| 5,111,392 | 5/1992 | Malin | 364/401 |

Primary Examiner—Thomas G. Black
Assistant Examiner—Thomas S. Auchterlonie
Attorney, Agent, or Firm—Gregory Garmong

[57] ABSTRACT

An interactive method for designing and detailing cabinets utilizes a computer for storing design constraints and standards in a database and for performing the tedious parts of cabinet placement, costing, and planning. The user is freed from performing these functions and is able to focus on the esthetic aspects of the cabinet design, including cabinet placement and appearance. The computer creates an initial cabinet placement based upon constraints provided by the user, so that the user may modify an existing custom design. The user views the layout of the entire room or parts thereof at each stage of the design process on a video display terminal in three dimension, elevation, or plan views, permitting the use of computer aided design techniques. The user may make custom modifications to cabinet designs by overriding the standards or creating new standards at any point, and the changes are immediately incorporated into all aspects of design and detailing. The database includes the design constraints of the cabinetmaker, so that the cabinets as designed are capable of construction, and bidding is based upon actual costs.

19 Claims, 3 Drawing Sheets

METHOD FOR DESIGNING AND DETAILING CABINETS

This application is a continuation, of application Ser. No. 449,501, filed Dec. 1, 1989 now abandoned which is a continuation, of application Ser. No. 207,725, filed Jun. 16, 1988 and now abandoned.

BACKGROUND OF THE INVENTION

This invention relates to the designing and detailing of cabinets, and, more particularly, to a computer interactive method of designing and detailing cabinets.

The designing and detailing of the array of wall cabinets presents one of the more time consuming and tedious problems in the interior design of rooms. Cabinets are designed and constructed to fit the available wall space of a room. For some rooms, such as kitchens, storage rooms, and some office spaces, there are normally a large number of cabinets, many of which have particular constructions designed to provide special functions. The cabinets are usually present in vertically displaced groups. The placement and dimensioning of the cabinets is highly constrained by the existing wall space features of the room, such as doors, windows, central islands, and the like. For kitchen cabinets, the placement of appliances such as refrigerators, stoves, dishwashers, and trash compactors also constrains the selection and design of the cabinets.

Equally importantly, the selection and placement of cabinets is determined in part by esthetic considerations. In one form, the esthetic considerations require that some degree of symmetry be achieved. For example, the doors in upper cabinets typically align with doors in base cabinets, so that the array of cabinets appears regular and symmetrical. In another form, the personal tastes of the person using the room are a strong determinant of the placement and dimensions of the cabinets. Homemakers, the greatest users of kitchen cabinets, typically have strong preferences about the placement of the various types of cabinets for storing dishes, pans, utensils, and tools, about the appearance of the faces of the cabinets, and about the convenience of use of the cabinets.

The design is even further constrained by the constructional requirements of the cabinetmaker, such as the need to achieve a proper assembly of the cabinets. Finally, the design is determined in part by the costs to build and install the cabinets.

The general layout of a room of cabinets is a cooperative effort between the purchaser and the cabinetmaker, and such effort is termed in the art "designing" of the cabinets. Once the design is established, a cabinetmaker develops lists of parts, cutting lists, and costs for the design, a process termed "detailing". Traditionally, it has been the practice for the purchaser (or the purchaser's architect) to sketch his idea of a design and provide it to the cabinetmaker. The cabinetmaker evaluates the design to determine from experience whether the sketched array of cabinets is likely to meet the various needs of the purchaser and whether it can be built in a self consistent fashion. The cabinetmaker then usually determines a bid cost to build the cabinets by calculating the product of the cost per foot (determined from the cabinetmaker's experience) times the total length of cabinets required. The cabinetmaker then must prepare complete designs, cutting plans, and instructions for purchasing, cutting, and assembling the required materials into final cabinets.

The traditional approach has many shortcomings. The cabinetmaker is at risk if his bid cost is significantly less than his actual cost to build the cabinets, because either he will lose money on the job or be forced to raise his bid to the purchaser. Bidding is competitive with other cabinetmakers, so that there is a tendency to bid a low price to get the work, but such bidding practice increases the chance of an error and a financial loss on the job. The cabinetmaker spends a large fraction of his time on each job in doing the calculations and preparing the construction plans, a cost that must be included in the job cost. Moreover, because of the great amount of detail required for the 10-40 cabinets typically required in rooms such as kitchens, mistakes often occur in the planning, necessitating rebuilding cabinets or other changes.

From the customer's point of view, the traditional approach does not permit a careful consideration of the various types of designs that are possible in light of the costs of purchase. The customer must ordinarily rely on a single design given to the cabinetmaker, without regard to the possibility that relatively minor modifications in design would reduce the cost significantly or be more useful to the customer.

The principal obstacle to a more controlled procedure for detailing cabinets has been the large amount of complexity in the planning of cabinet construction. Each cabinetmaker has personal preferences, gained from experience, that shape his planning and, consequently, his costs. The layout of cabinets to meet these constraints, as well as the functional and esthetic requirements of the purchaser, is time consuming and often tries the patience of both purchaser and cabinetmaker. The result is that there is typically less attention paid to developing a buildable design that meets the requirements, than otherwise might be given to the project.

In the past three years, there have been introduced computer interactive methods by which a portion of the calculations performed by the cabinetmaker can be automated. The purchaser can view a computer-generated representation of the cabinets, and adjust the design. Although these methods provide an important step forward in the designing and detailing of cabinets, they lack many of the essential features required to improve flexibility and increase convenience. There is therefore a need for an improved approach to designing and detailing cabinets, in which the user has greater flexibility in selecting the design and detailing approach. The present invention fulfills this need, and further provides related advantages.

SUMMARY OF THE INVENTION

The present invention provides an interactive computer-based approach for designing and detailing cabinets. It permits wide flexibility in the definition of standards used in cabinet design, and the adjustment of placement and appearance during the design process. Advanced graphics allow the users, both the purchaser and the cabinetmaker, to view the design of the cabinets as it evolves.

In accordance with the invention, a method for designing and detailing cabinets to fit within an available space, using an interactive computer system operated by a user, comprises the steps of the computer establishing a database of design standards customized for the user, the step of establishing including the user inputting values for system defined standards of cabinet design, the computer permitting the user to create custom defined design standards and permitting the user to input values for the custom defined design standards; the user selecting constraints for the placement of the cabinets; the computer filling the available space remaining after the step of selecting, by dimensioning base cabinets according to the standards of the database, adding upper cabinets corresponding in placement and width to the base cabinet directly below each upper cabinet, and accepting modification to the placement or dimension of a cabinet or element thereof by the user, thereafter repeating the steps of dimensioning and adding; the computer completing final design of the cabinets, by establishing all finishing details of each cabinet from the database; the computer detailing the cabinets to establish a cutting list, a bill of materials, and projected costs of manufacture, the visual appearance of the cabinets being visible to the user on a video display terminal at each of the steps of selecting an array, filling the available space, and completing the final design.

In other aspects, the present invention includes a method for designing cabinets to fit within an available space, using an interactive computer system operated by a user, comprising the steps of the computer establishing a database of design standards customized for the user, the step of establishing including the user inputting values for system defined standards of cabinet design, the computer permitting the user to create custom defined design standards and permitting the user to input values for the custom defined design standards; creating an array of cabinets based upon the database so established.

Also in accordance with the invention, a method for designing cabinets to fit within an available space, using an interactive computer system operated by a user, comprises the steps of establishing a database of cabinet design features and standards; the user selecting constraints for the placement of the cabinets; the computer filling the available space remaining after the step of selecting, by adding and dimensioning cabinets according to the standards of the database.

Further in accordance with the invention, a method for designing and detailing cabinets to fit within an available space, using an interactive computer system operated by a user, comprises the steps of designing an array of cabinets, the design data for the cabinets being stored in a database; the computer completing final design of the cabinets, by establishing finishing details of each cabinet from the database and storing the finishing details in the database; and the computer detailing the cabinets to establish the projected costs of manufacture based upon actual costs, using the finishing details of the cabinet design as stored in the database.

An important objective of the present approach is to shift to the computer as much of the process of design and detailing as possible, while leaving the user free to devote his primary attention to appearance and final placement of the cabinets. This objective is achieved in part by incorporating the elements of cabinet design and detailing into the instructions of the computer. Important advances over prior methods include the shifting to the computer of initial cabinet placement operations, the provision of user created standards and override parts functions to increase flexibility in shifting work to the computer in customizing the cabinets, and enhanced graphics capability so that the computational power of the computer allows the viewer to visualize the designs in several ways and modify the designs.

The design philosophy of the method for designing and detailing cabinets utilizes a database that serves as the focal point for the determination of cabinet design parameters and constructional constraints, and for the calculation of costs. The database includes basic design and detailing parameters provided by the user. The parameters may be tailored for any general style of cabinet design, such as, for example, face frame or frameless cabinets (as in the popular 32 millimeter European style). In prior computer based detailing approaches, the database was limited to parameters thought important by the computer programmer. Inevitably, individual users of the system would feel that other parameters were important. The inability to adjust these parameters significantly inhibited the user friendliness and acceptability of the systems. The present approach allows the database to be taught the individual preferences of the user, and for these preferences to be modified generally or for a particular job.

The database of the present invention permits customization at several levels. The underlying system database can be modified for user preferences, so that, for example, all cabinets will be built with a particular type of end construction. The data base for a particular job can be altered, so that all cabinets for that job will be built with the particular end, but on the next job the system will revert to the style set forth in the system database. The custom features introduced in the database are maintained throughout all further calculations and displays.

The database may include a standard library of cabinets, portions of cabinets, or other features from which the user may choose. The standard library or individually created cabinet designs can also be altered to customize features of individual cabinets in a job, and permit those features to be changed in any manner desired by the user. If, then, the customized cabinet is altered in location or dimension by the design elements of the method, the custom features also change in a manner such that the altered cabinet properly reflects the user's wishes.

The present approach therefore provides numerous automated features that shift the burden of detailing to the computer, once the design standards have been entered into the database. A user may, after reviewing the trial design developed by the computer, make further customizing changes. An example would be to add a new, extra drawer in a particular base cabinet, which otherwise would be designed according to the existing database. This "override parts" feature is another form of modification to the database, but enlarges the flexibility of design to permit features to be completely added, removed, or revised, not just redimensioned according to existing dimensions in the system. Once information is entered into the database by the parts override function, that information is incorporated into future design changes and calculations for the particular job or all jobs, as appropriate.

The graphics system of the present approach is significantly enhanced over prior detailing programs. All database and current design features may be displayed either in plan view, elevation view of selected walls, or three dimensional perspective from any selected view point. Overlying the automated design steps accomplished by the computer is a computer aided design (CAD) capability that permits the visualization of custom features.

The present method also provides an important improvement over existing techniques in respect to the determination and estimation of actual costs for manufacturing the cabinets. Most cabinetmakers presently estimate total manufacturing costs on a per-foot basis, wherein the number of linear feet of cabinets is multiplied by a manufacturing cost per foot, based upon the cabinetmaker's personal experience. The database of the present approach includes user-supplied unit cost information for both materials and labor, so that the actual costs are calculated for any selected cabinet design. The user is therefore able to associate a cost with each design, and evaluate the effect on cost of design changes. The cabinetmaker is able to make better estimates when jobs are bid, reducing the risk of losses in completing the job. After costs are determined, a contract can be printed, using a custom form of contract. The system also prints a bill of materials for the cabinetmaker, avoiding errors in preparing materials orders from the approved customer plans.

Although the above summary has focussed primarily upon the design and detailing of custom cabinets, the database library can also (or in the alternative) be provided with the features of mass produced cabinets available for purchase from manufacturers. Designing can be accomplished with cabinets available from the manufacturers' catalogs, reducing the overall cost of the cabinetry to the customer. In this form, the database efficiently performs the catalog lookup function that otherwise must be done by the user.

The present invention therefore provides an important advance in the art of designing and detailing of cabinets. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENT

Figure 1:
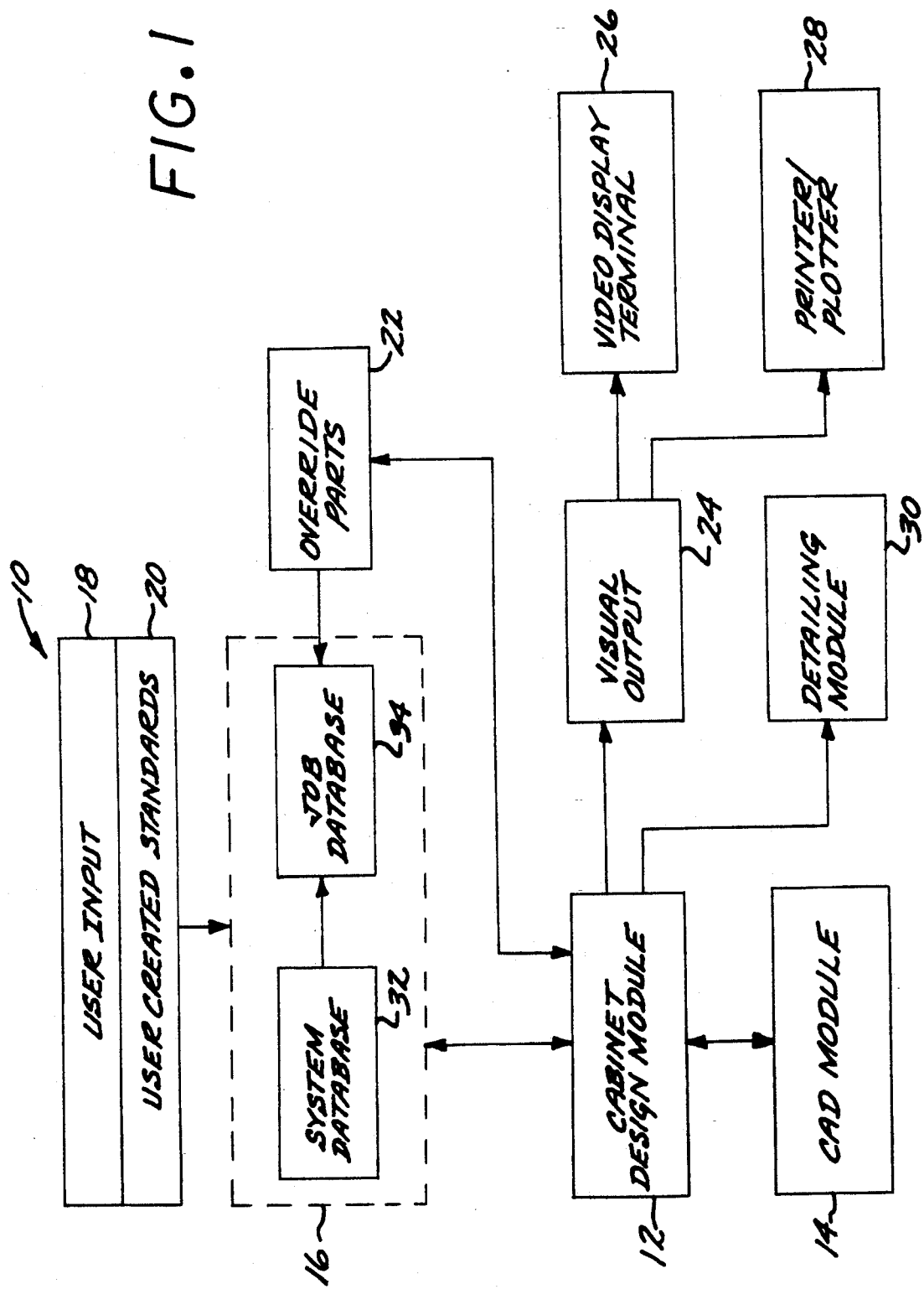
FIG. 1 is a schematic representation of the system of the invention.

A system 10 employing the general approach to cabinet designing and detailing is illustrated in FIG. 1. The system 10 utilizes an interactive computer approach for establishing a database that is manipulated by a user in order to design cabinetry. It has been implemented on an IBM compatible personal computer. The method utilizes a design module 12 that, in cooperation with the human user, accomplishes the initial and final design of the cabinetry. The design module 12 is overlaid by a CAD (computer aided design) module 14 that permits graphic modifications to the design of the cabinets in the design module 12. A data base 16 provides information to the design module 12 about the common features, standard data, previously input information, and constraints. The data base 16 is modified and supplemented in several ways, including initial user input 18, user created standards 20, and override parts modifications 22.

From the design module 12, information is output to a visual output module 24, which provides external communication to a video display terminal 26 and a printer/plotter 28. A detailing module 30 performs calculations of useful information such as costs and bills of materials utilizing the information from the design module 12.

Figure 2:
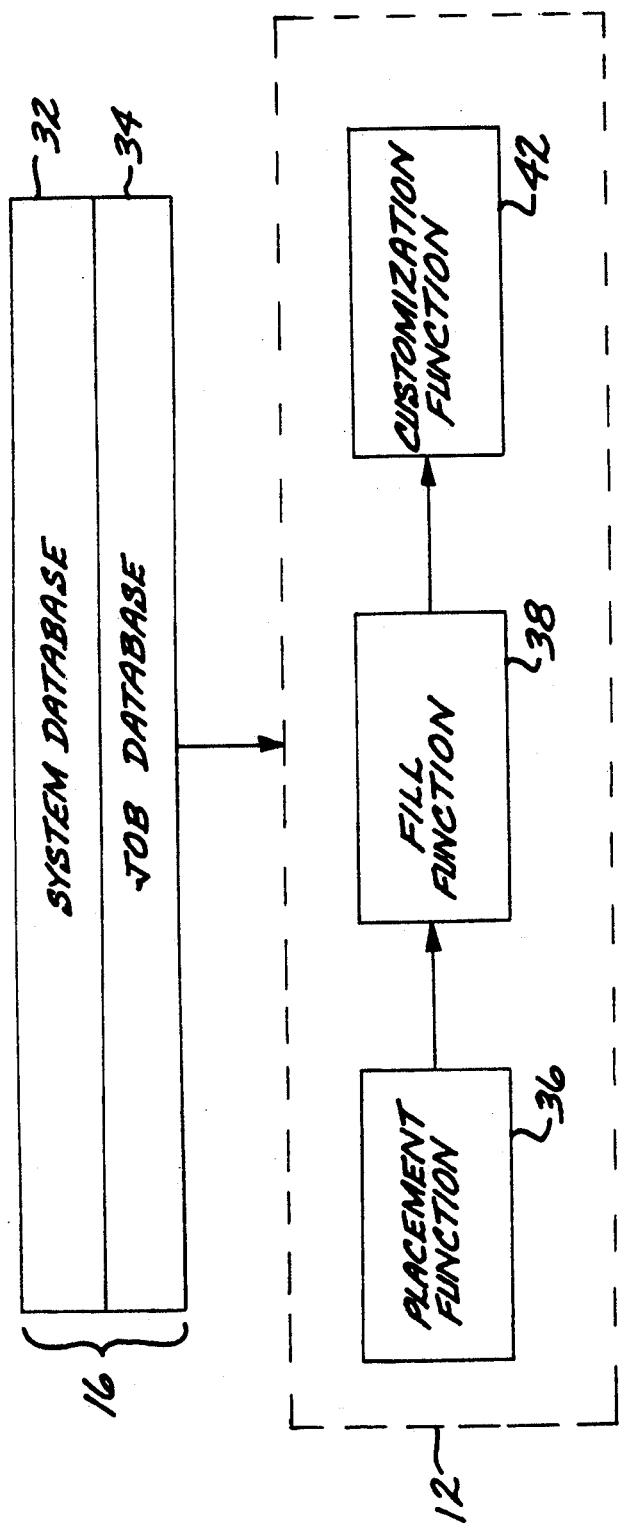
FIG. 2 is a schematic representation of the process of the design module.
Figure 3:
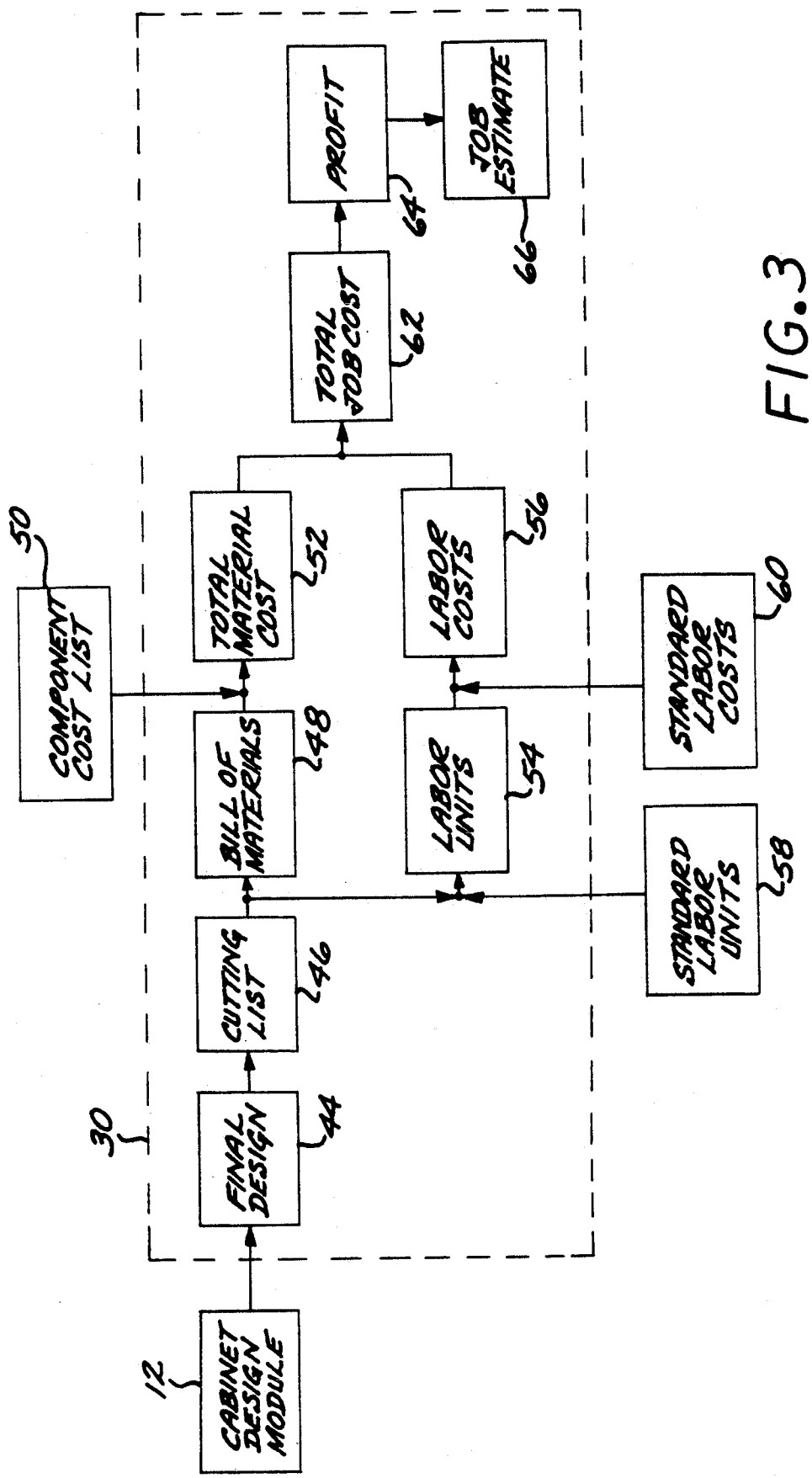
FIG. 3 is a schematic representation of the process of the detailing module.

The lines and arrows in FIGS. 1-3 indicate normal paths of information flows, not time sequences or the order of events. The system 10 is constructed so that the user can modify the data base 16 at any time, from any point in the system, can output results at any time, and so forth. The following discussion is presented in terms of a typical sequence of events, although the sequence is readily varied in particular circumstances.

The design module 12 and its relationship to the other elements is illustrated in greater detail in FIG. 2. For the sake of definiteness, the use of the system 10 will be described in relation to its use in designing and detailing kitchen cabinets. The use in regard to kitchen cabinets reflects a common application of the present invention, but the invention is not so limited.

The database 16 includes two parts, a system database 32 that includes data common to all jobs, and a job database 34 that includes data for only the job at hand. The system database 32 is resident in the computer. The job database 34 is also resident for a particular job, and can be saved for later reference or revision. The system database 32 includes the essential design information for cabinets, such as a library of standard cabinets, detailing preferences of the cabinetmaker (provided by the individual cabinetmaker), standard costs, and standard materials. The job database 34 initially is empty, and a copy of the then-existing system database 32 is copied into the job database 34 at the beginning of a job. The user also provides identification of the job into the job database 34. Later, and as will be described, the job database 34 is supplemented to include information such as the room configuration, locations and sizes of fixed objects in the room, and selected cabinet arrangement and characteristics as they are developed.

As with nearly all parts of the system 10, additions to and modification of the database 16 are made responsive to menu selections. A menu-driven approach minimizes confusion for persons not accustomed to using computers, as is the case for many cabinetmakers and their customers. Graphic information is entered with a keyboard or mouse.

After the database 34 is initially established for a job, the system moves to a placement function 36. During the placement function 36, the system 10 may be operated in a three dimensional placement mode, a wall-by-wall elevation placement mode, or a plan view placement mode. Each mode provides the indicated view corresponding to the arrangement of the room at that time, as provided from the job database 34. The user may switch back and forth between these modes, and the arrangement presented will always correspond to that of the current version of the plan, because it always draws from the job database 34. In the following description, the three-dimensional mode of operation is presented in detail, with reference as needed to the other modes.

During the placement function 36, the user provides the room layout arrangement and the placement and dimensions of major locational constraints such as door-ways, windows, and appliances. The location and dimensions of special cabinets that must occupy a particular location and be of particular size, and therefore are comparable to fixed appliances, are also entered. The entered information is provided to the job database 34 and also to the visual output function 24. The visual output function 24 normally displays the relevant information on the video display terminal 26, so that the user continuously sees the progress of the detailing, but the information can also be displayed on the printer/plotter 28 as needed. In the three dimensional display mode, icons are called from the job database 34 to represent the appearance of each element, so that a displayed refrigerator, for example, physically resembles the appearance of a refrigerator. The display is presented in color, further enhancing the similarity of the display to the actual expected finished appearance of the room.

During the placement function 36, the user may also select the character and appearance of particular cabinets and accessories from a catalog of custom parts and accessories contained in the job database 34. An example of a custom part is the style of the cabinet doors, a feature of particular importance to designers. Entering the catalog of custom parts from the menu, the user is shown a selection of different parts that are available, as for example the appearance of all door styles that may be produced by the cabinetmaker. These styles were previously entered by the cabinetmaker into the systems database 32. The user selects a style, and then is permitted to choose, under menu control, the materials to be used and the identities of the cabinets with which the style is to be used. Different styles can be used on different cabinets. A catalog of custom accessories, such as trays or baskets, that might be used in the room, is also available for selection. The user is permitted to make these selections in the placement function 36, but can also make the selections or modify previously chosen selections in later stages of the design process.

This process of customized creation of particular features of the cabinets, from a vast array of possibilities in the database 16, is an example of a user created standard, illustrated in FIG. 1 at numeral 20. Such user created standards have not been previously available in interactive methods for designing cabinets. The user can create, for use in designing and detailing his job, a custom design of any part or combination of parts used in manufacturing the cabinet. This custom design is stored in the database, and utilized in the detailing operation 30. The ability to create and detail such custom designs is an important advantage not heretofore available. In conjunction with the design features discussed subsequently, the user is able to try different appearances and features for the cabinets, and to quickly evaluate the effect of the choices on the difficulty and cost of cabinet manufacturing. Any aspect of the custom feature that is visible (such as a door facing) is viewed in the visual output 24, so that the user can evaluate the esthetic appeal at the same time as the cost is considered.

After the major locational and dimensional constraints are established by input from the user in the placement function 36, an initial cabinet layout of base cabinets is made by the computer as a baseline to work from, in the fill function 38. The base cabinets are the cabinets that rest on, or just above, the floor, and whose position is constrained by the presence of appliances that rest on the floor. The computer selects an initial array of cabinets from that portion of the job database 34 that has been copied from the systems database 32. The initial array of cabinets is selected according to any approach as may have been built into the system, that yields an acceptable array. In the preferred approach, the linear distance between adjacent fixed constraints is the starting point. From this value the length of end stiles is subtracted. The remaining space is filled with the smallest number of cabinets that are equal to each other in cabinet opening dimension but whose individual linear dimension does not exceed a value previously input to the data base 16.

Once the placement and dimensions of the base cabinets are established in the fill function 38, the system designs a group of upper cabinets that are inserted where the base cabinets do not extend to a height that precludes upper cabinets. The upper cabinets are initially selected to be vertically aligned with the base cabinets, as this uniformity and symmetry is ordinarily sought by the user. The upper cabinets are selected according to any design rule provided to the job database 34. In the preferred approach, shelved cabinets having single or double doors, depending upon the width of the underlying base cabinet, are selected. Their widths are chosen so that the upper cabinets align with the lower cabinets, for appearance. The types and sizes of the upper cabinets are provided to the job database 34 and to the detailing function 30 and the visual output 24.

This initial array of cabinets, provided by the computer driven fill function 38 using the constraints provided by the user in the placement function 36, is a starting point for further customization which, when displayed, gives the user the opportunity to actually see a representation of the room as it could be when complete. The array is provided to the visual output 24, together with the dimensions of the selected cabinets and any constraints on their dimensions.

During the fill function 38, the computer checks the selections of the user against constraints from the database 34. For example, one constraint requires that adjacent cabinets not overlap each other, as overlap is physically not permitted. Another constraint requires that doors should be physically accessible, so that at corners the constraint does not permit the placement of a cabinet's door so that it must open to the interior of another cabinet. Instead, a corner filler unit is placed at the corner. At this point, an array of cabinets (although not necessarily the final array of cabinets) has been designed and placed to fill the available space and satisfy the constraints for the job and for the system. Any other particular constraints can be provided to the system database 32 by the user.

It is important to distinguish this approach from the prior method of interactively designing the arrangement of cabinets. Previously, the user manually added cabinets, appliances, and constraints beginning at one end of each wall. There was no automatic, computer generated, fill function following the placement of constraints. Because the constraints and appliances were added along with the cabinets, the user was required to keep track of, and adjust for, constraints as they were encountered. Then, as modifications to the cabinets were made in later steps, the user was required to bear in mind the constraints. The present approach allows the user to provide constraints at the beginning of the design process. The computer keeps track of their location, dimension, and appearance, without further attention from the user. The user may, if desired, intentionally alter the position and location of constraints such as appliances to determine the effect upon the room. Absent such intentional alteration, no further attention by the user is required.

It is, of course, unlikely that the computer-generated initial layout of cabinets made in the fill function 38 will be totally acceptable to the user. Extensive opportunity to revise the initial layout is provided in the customization function 42. A particular aid to the customization function is the ability to selectively view the room layout in any one of three views, the plan view, the elevational view, or the three-dimensional view. The three-dimensional view is often preferred during the initial placement and fill functions discussed above, to visualize the final design of the room. The plan view or the elevational view, which desirably display the dimensions of the cabinets and constraints, permit detailed consideration of design features that can significantly reduce cost while having little impact upon esthetics.

For example, it may have been determined by the customer that a particular appliance, such as a stove, should be placed on a particular wall, but the precise location along the wall was made arbitrarily in the placement function 36. If the arbitrary placement in turn caused the computer to select an overly complex array of cabinets, the user will often recognize the unneeded complexity and be able to adjust the position of the arbitrarily placed appliance so as to reduce the complexity. Experience has shown that this type of design improvement can often be made most readily by switching from the three-dimensional view to the elevational view, where small dimensional irregularities can be readily detected. To aid in making adjustments of the type described here, a "center" function is provided so that the indicated element is automatically centered between constraints, without changing its size. Centering operates by calculating the distance between the constraints, subtracting the dimension of the object to be centered, and replacing the object at the center of the remaining space. Centering reduces costs by causing cabinets on either side of the centered object to be equalized in dimension.

In a specific example, it was observed that the movement of a stove by only one inch along the wall significantly reduced the cost of a set of kitchen cabinets. Such a small movement is hardly noticeable to the purchaser of the cabinets, but can greatly reduce the complexity and cost of manufacturing irregularly sized cabinets. The visual effect of any such change can be evaluated immediately by switching back to the three-dimensional view, which, because it draws its information from the altered job database 34, incorporates the change. The cost effect can be evaluated immediately by viewing the results of the detailing module 30, to be discussed in greater detail later.

The modification of the cabinet design in the customization function may occur by any of several procedures. Most modifications are produced by working through a series of menus provided in the system, to reach the appropriate menu containing the questions that must be answered to make the change. In most such menu trees, there are only two levels of menus that are encountered, so that the problem is not perceived as formidable by the user.

Some examples of conventional modifications are provided, but it should be appreciated that any previously defined characteristic of the cabinets or constraints such as appliances is open to modification. (Previously undefined features are also available for creation and modification by the "override parts" function to be discussed subsequently.) The location or type of any cabinet may be changed. In the preferred embodiment, the graphics package permits these modifications to be made with a mouse or by keyboard. Numerical or qualitative standards in the database 16 may be changed directly. For example, the material of construction (e.g., all cabinet backs to be made of plywood rater than particle board) or the dimension of a particular fixed cabinet (a broom closet, for example) may be altered. Physical dimensions, otherwise fixed, may be changed. For example, stile widths and cabinet heights may be altered.

Although the present system 10 was designed to attempt to include every possible design modification of interest in the group of directly changeable standards, the "override parts" function 22 is provided in the event that the system does not include a modification conceived by a particular customer. That is, the user created standards function permits modification of previously defined standards, and the override parts function permits creation of new standards. For example, a customer might wish to have all shelves in a cabinet with three inches less depth than the depth that they might otherwise be assigned. The override parts function 22 provides a menu designed to accommodate such changes. The function 22 first identifies the cabinet to be changed, and the type of change (add a feature, delete a feature, change a feature) that is to occur. The feature is identified, and, where the feature is added or changed, the characteristics (depth, length, material of construction) are specified. The mode of variation with changes in the cabinet is specified, such as, for example, whether the feature gets longer as the cabinet gets longer or whether the feature is of constant width. The modifications to the feature and the cabinet are introduced to the job database 34, and thereafter the modification is included in all further design optimizations, detailing, pricing, and display.

The interactive design procedures for the cabinets are repeated as many times as necessary to achieve a design that is esthetically and functionally satisfactory to the user. Supporting the interactive design functions are internal computer detailing functions 30 performed for each selected design, whose results are displayed upon command but in whose operations the user takes no direct part (except for having provided the basic data used in the calculations). These functions are illustrated in FIG. 3. In general, these functions transform the structure of the selected visual design into information that is valuable to the cabinetmaker, such as cutting lists, and information that is valuable to the customer, such as cost.

A final design function 44 recalls the details of cabinetry manufacture from the database 34, for each cabinet to be manufactured. Such details include, for example, the type of back and sides for each cabinet, standard hinge arrangements, stile widths, end scribe, rail sizes, toe heights, and materials of construction for each element. These details of manufacture, which are typically not considered by the customer but which often occupy hours of calculating time for a cabinetmaker, are supplied automatically from the database. Information on these details is provided to the system database 32 once by the cabinetmaker, thereby "teaching" the database the cabinetmaker's preferred constructional techniques. For each type of cabinet, during construction of the database 32 the cabinetmaker is queried as to the number of walls (some cabinets may be made without backs, for example), thickness of material, types of hinges, dimensional characteristics, and the many other details of construction for that cabinet. That type of construction is utilized for that cabinet in detailing all jobs until the system database 32 is modified, unless the job database 34 for a particular job is modified. The system or job databases can, of course, be modified at any time. Once the details of construction are selected from the systems database 32 and entered into the job database 34, they can also be modified in accord with customer preferences for that particular job, without changing them in the systems database 32.

The final design process 44 includes the internal listing of each type of cabinet selected and each part required for the manufacture of that cabinet. The types of cabinets are provided from the design module 12, and the parts required for each cabinet from the database 34. This information is used to compile a summary of all parts required to construct the cabinets, termed a manufacturing cutting list 46. The cutting list of the final selected design is printed by the cabinetmaker, and serves as one of the key guides in the manufacturing process. Errors in hand compiling the cutting list are a major source of errors in cabinet manufacture, and these errors are completely avoided using the present approach.

As shown in FIG. 3, the ordering of material, providing of labor, and estimating of costs flows from the cutting list 46. The cutting list 46 includes a full parts listing of every piece of material and hardware required to construct the cabinets. A materials requirements routine 44 determines the number of standard pieces of material such as wood, plastic, or the like that must be purchased to provide the necessary material for the job (i.e., the number of 4 foot by 8 foot sheets of plywood that must be purchased so that the required cabinet backs and sides can be cut therefrom, etc.). This determination may be provided either using an average waste factor for particular part, or an analysis wherein the optimum method for cutting the pieces from stock is calculated. The material requirements and the hardware requirements together provide a bill of materials 48.

The database 34 also includes a listing of standard purchase prices for each piece of material and item of hardware that must be purchased to complete the job, the component cost list 50. By arithmetical calculation, the total cost of material and hardware is determined to provide total material costs 52, by multiplying numbers of items times their costs, and adding the products.

The labor costs 56 and total units (hours) of labor 54 of each type required to manufacture the cabinets are determined from the design of the cabinets to be manufactured and standards in the database 34. Standard units of labor 58 required to perform the various cabinetry construction operations are determined from the experience of the cabinetmaker, and input to the database 16. Depending upon that experience, it may be preferable to establish units of labor required for very specific operations (e.g., making a saw cut, fastening a hinge), or for the construction of an entire cabinet, or for construction by the linear unit, or any other measure found useful by the cabinetmaker. Whichever is preferable for the cabinetmaker, the experience is entered into the system database 32. The standard units of labor 58 are used in conjunction with the proper information from the design module 12 or the cutting list 46 to calculate a number of units of labor required 54. The sum of the products of the standard labor costs 60 per unit of labor, stored in the database 34, times the number of unit operations required 54 is the total labor costs 56.

The sum of the material costs 52 and the labor costs 56 is the total job cost 62. A profit 64 is added, either as a dollar figure or as a percentage, to yield the total job estimate 66. Alternatively, the profit can be included in each standard material and labor cost, so that no separate profit is added. Normally, the profit figures are not displayed to the customer, and are only available to the cabinetmaker through a pass word, so that the customer is not tempted to haggle over profit.

The final job cost estimate 66 is of greatest interest to the customer, but other information generated in the detailing routine 30 is of particular interest to the cabinetmaker. The bill of materials 48 is used to make purchases of materials to inventory. The cutting list 46 is used when the materials are segregated from inventory and cut or processed, as necessary, and as a check list of components at the time of assembly of the cabinets. The labor units 54 calculation is used to schedule manufacturing operations and manage factory operations including the hiring of labor requirements. Finally, at the completion of a job, the actual labor and materials usage can be compared with the projected values to determine the sources of error and permit continuing improvement in the standard values used to estimate job costs. These values are in turn entered into the database 32, so that better estimates are available for estimating future jobs.

The system 10 also includes the CAD capability 14, which permits the user to draw features not generated by the computer. For example, the customer may wish to visualize the cabinets with some features that are not to be constructed by the cabinetmaker and do not affect costs. The customer might wish to visualize the cabinets with various cabinet top appliances in place, such as a toaster, mixer, and the like. These appliances do not constrain the cabinet placement or design, and do not enter the cost and materials calculations. The CAD system permits such features to be added and retained in the job database 34 for output to the visual output 24, without being utilized otherwise in the system.

The present system 10 provides an integrated system for designing and detailing cabinets for kitchens, offices, and other rooms. It achieves results not achievable by manual procedures, by relegating the tedious aspects of the design work and most of the detailing work to a fully automated computer operation and by displaying designs that can be directly linked to detailing results, so that the effects of design changes can be evaluated. When detailing is done manually, there is simply not enough patience and time for the customer and cabinetmaker to work together to develop such fully integrated designs.

Although a particular embodiment of the invention has been described in detail for purposes of illustration, various modifications may be made without departing from the spirit and scope of the invention. Accordingly, the invention is not to be limited except as by the appended claims.

What is claimed is:

1. A method for building cabinets to fit within an available space, comprising the steps of:
   a computer establishing a job database comprising cabinet design standards customized for a user, the job database having cabinet design standards initially provided in the job database, and user-defined cabinet design standards that are fully defined by the user, the cabinet design standards including layout rules for the type, configuration, and positioning of cabinets to fit within an available space and construction rules for the construction of the individual cabinets, the step of establishing including the steps of the computer copying from a system database an initial job database of system-defined cabinet design standards having parameters that may be modified by the user, the user selectively modifying parameters for system defined cabinet design standards in the job database, the computer permitting the user to selectively create custom defined cabinet design standards in the job database and permitting the user to input values for the custom defined cabinet design standards into the job database;

the user providing available space constraints for the placement of the cabinets, the placement being the designed location in space occupied by the cabinets;

the computer filling the available space of the base cabinets and the upper cabinets remaining after the step of providing, by selecting an array of base cabinets according to the layout design rules of the database and the available space constraints, adding upper cabinets, each corresponding in location and lateral dimension to the base cabinet directly below the upper cabinet, and accepting modification to the placement or dimension of a cabinet or element thereof selectively by the user, thereafter repeating the steps of selecting an array and adding;

the computer completing final design of the cabinets using the construction rules of the cabinet design standards in the job database;

the computer detailing the cabinets to establish a cutting list, a bill of materials, and projected costs of manufacture, and printing the cutting list, bill of materials, and projected costs of manufacture, the computer providing a user-selected elevational or three dimensional current image of the visual appearance of the design of the cabinets to the user on a video display terminal at each of the steps of selecting, filling the available space, and completing the final design; and building an arrangement of cabinets according to the design produced responsive to the interaction between the user and the computer.

2. A method for designing a group of cabinets to fit within an available space and for producing instructions for the building of the group of cabinets, using an interactive computer system operated by a user, comprising the steps of:

the computer establishing a job database comprising cabinet design standards customized for the user, the job database having cabinet design standards initially provided in the job database, and user-defined cabinet design standards that are fully defined by the user, the cabinet design standards including layout rules for the type, configuration, and positioning of cabinets to fit within an available space, the step of establishing including the steps of the computer copying from a system database an initial job database of system-defined layout rules that may be modified by the user, the user selectively modifying parameters for system defined layout rules in the job database, the computer permitting the user to selectively create custom defined layout rules and permitting the user to input values for the custom defined layout rules into the job database;

the user providing available space constraints for the placement of the cabinets, the placement being the designed location in space occupied by the cabinets;

the computer filling the available space with a grouping of cabinets based upon the job database so established by applying the design rules of the job database, and outputting instructions on the building of the group of cabinets, the visual appearance of the design of the group of cabinets being selectively visible to the user on a video display terminal in elevational or three-dimensional views.

3. The method of claim 2, wherein the step of permitting the user to create custom defined design standards includes establishment of a user created standard.

4. The method of claim 2, wherein the step of permitting the user to create custom defined design standards includes a step which overrides the selection of parts on the cabinet design.

5. The method of claim 2, wherein an array of base cabinets is first established by the computer in the step of filling the available space, and then an array of upper cabinets is established corresponding in placement and width of the base cabinet directly below each upper cabinet.

6. The method of claim 2, including the further step, as part of the step of filling, of:

accepting modification to the placement or dimension of a cabinet or element thereof by the user, thereafter repeating the steps of adding and dimensioning.

7. The method of claim 6, wherein, in the step of accepting modifications, the dimensions of the base cabinets are selected from library values.

8. The method of claim 2, wherein the system database includes a library which contains types of standard cabinets.

9. The method of claim 2, wherein the system database includes a library which contains components for cabinets that may be modified by the user and included in the design.

10. The method of claim 2, wherein the system database includes a library which contains custom accessories that may be used with the cabinet design.

11. A method for building cabinets to fit within an available space, comprising the steps of:

a computer establishing a job database comprising cabinet design standards customized for a user, the job database having cabinet design standards initially provided in the job database, and user-defined cabinet design standards that are fully defined by the user, the cabinet design standards including layout rules for the type, configuration, and positioning of cabinets to fit within an available space, the step of establishing including the steps of the computer copying from a system database an initial job database of system-defined layout rules that may be modified by the user, the user selectively modifying parameters for system defined layout rules in the job database, the computer permitting the user to selectively create custom defined layout rules in the job database and permitting the user to input values for the custom defined layout rules in the job database;

the user providing available space constraints for the placement of the cabinets, the placement being the designed location in space occupied by the cabinets;

the computer filling the available space with a group of cabinets based upon the job database so established by applying the design rules of the job database and outputting instructions on the building of the group of cabinets, the visual appearance of the design of the group of cabinets being selectively visible to the user on a video display terminal in elevational or three-dimensional views; and building an arrangement of cabinets according to the design produced responsive to the interaction between the user and the computer.

12. A method for designing and detailing a group of cabinets including base cabinets and upper cabinets to fit within an available space and providing instructions for the building of the cabinets, using an interactive computer system operated by a user, comprising the steps of:

the computer establishing a job database comprising cabinet design standards customized for the user, the job database having cabinet design standards initially provided in the job database, and user-defined cabinet design standards that are fully defined by the user, the cabinet design standards including layout rules for the type, configuration, and positioning of cabinets to fit within an available space and construction rules for the construction of the individual cabinets, the step of establishing including the steps of the computer copying from a system database an initial job database of system-defined cabinet design standards having parameters that may be modified by the user the user selectively modifying parameters for system defined cabinet design standards in the job database, the computer permitting the user to selectively create custom defined cabinet design standards in the job database and permitting the user to input values for the custom defined cabinet design standards into the job database;

the user providing available space constraints for the placement of the cabinets, the placement being the designed location in space occupied by the cabinets;

the computer filling the available space of the base cabinets and the upper cabinets remaining after the step of providing, by selecting an array of base cabinets according to the layout design rules of the database and the available space constraints, adding upper cabinets, each corresponding in location and lateral dimension to the base cabinet directly below the upper cabinet, and accepting modification to the placement or dimension of a cabinet or element thereof selectively by the user, thereafter repeating the steps of selecting an array and adding;

the computer completing final design of the cabinets using the construction rules of the cabinet design standards in the job database; and the computer detailing the cabinets to establish a cutting list, a bill of materials, and projected costs of manufacture, and outputting the cutting list, bill of materials, and projected costs of manufacture, the computer providing a user-selected elevational or three dimensional current image of the visual appearance of the design of the group of cabinets to the user on a video display terminal at each of the steps of filling the available space and completing the final design.

13. The method of claim 12, including a further step, after the step of completing final design, of the computer printing a contract for construction of the cabinets, the contract to include a price based upon the projected costs of manufacture.

14. The method of claim 12, wherein the system database includes a library which contains types of standard cabinets used in the step of selecting an array.

15. The method of claim 12, wherein the system database includes a library which contains components for cabinets that may be modified by the user and included in the design.

16. The method of claim 12, wherein the system database includes a library which contains custom accessories that may be used with the cabinet design.

17. The method of claim 12, wherein the step of permitting the user to create custom defined design standards includes the establishment of a user created standard.

18. The method of claim 12, wherein the step of permitting the user to create custom defined design standards includes a step which overrides the selection of parts on the cabinet design.

19. The method of claim 12, wherein, in the step of the computer filling the available space, the dimensions of the base cabinets are selected by the computer from data in the library.

* * * * *

US005255207C1

(12) REEXAMINATION CERTIFICATE (4247th)

United States Patent
Cornwell

(10) Number: US 5,255,207 C1
(45) Certificate Issued: Jan. 9, 2001

(54) METHOD FOR DESIGNING AND DETAILING CABINETS

(75) Inventor: Larry Cornwell, 4405 Manchester, Ste. 102, Encinitas, CA (US) 92024

(73) Assignee: Larry Cornwell, Encinitas, CA (US)

Reexamination Request:
No. 90/005,015, Jun. 12, 1998

Reexamination Certificate for:
Patent No.: 5,255,207
Issued: Oct. 19, 1993
Appl. No.: 07/900,560
Filed: Jun. 18, 1992

Related U.S. Application Data

(63) Continuation of application No. 07/449,501, filed on Dec. 1, 1989, now abandoned, which is a continuation of application No. 07/207,725, filed on Jun. 16, 1988, now abandoned.

(51) Int. Cl.[7] ............................ G06F 17/50; G06F 17/60; G06F 151/800; G06F 153/800
(52) U.S. Cl. ............................... 703/1; 705/29; 705/400; 706/919
(58) Field of Search ........................... 364/572; 395/500, 395/500.27, 500.01; 705/29, 400

(56) References Cited

U.S. PATENT DOCUMENTS

| | | | |
|---|---|---|---|
| 4,754,410 | * | 6/1988 | Leech et al. ............................ 706/45 |
| 4,885,694 | * | 12/1989 | Pray et al. ............................ 705/400 |
| 4,920,499 | * | 4/1990 | Skeirik .................................... 706/11 |
| 4,922,432 | * | 5/1990 | Kobayashi ............................ 364/490 |
| 4,965,742 | * | 10/1990 | Skeirik .................................. 364/191 |
| 5,063,522 | * | 11/1991 | Winters .................................. 706/10 |

OTHER PUBLICATIONS

"A Look at the Cabinet Vision Software Program" article in *Wood and Wood Products Extra*, Jan. 1987.
Cabinet Vision Product Brief, Prior to Jun. 1987.
Cabinet Vision Update Version V10.3, Jan. 30, 1987.
Cabinet Vision Update Version F10.4, dated Mar. 6, 1987.
Binder–Cabinets at Your Fingertips II, prior to Jun. 16, 1987.
*Wood & Wood Products*, Aug. 1986.
*20–20 Computerized Kitchen Design Program*, Version 2.0(c) 1986 MKS Products, Inc., all pages, 1986.
A reprint of an article from the Sep. 1986 issue of *Kitchen & Bath Business* entitled, "Who's Who in Computers", pp. 88–100, Sep. 1986.
"The Detailer" advertisement in *Wood and Wood Products*, Nov. 1985.
*Wood & Wood Products*, Nov. 1985.
*Wood & Wood Products*, dated Jul. 1986.
*Wood & Wood Products*, dated Nov. 1986.
*Cabinet Manufacturing and Fabricating Today*, dated Sep. 1987.
*Furniture Design & Manufacturing*, Dec. 1987.
Operation of Cabinets ABC Version 4.11, all pages, Feb. 1985.
Quick–Draw/Quote Operating Instructions (GoldenWare, Inc.) (temporary material), all pages Nov. 13, 1986.

(List continued on next page.)

*Primary Examiner*—Kevin J. Teska

(57) ABSTRACT

An interactive method for designing and detailing cabinets utilizes a computer for storing design constraints and standards in a database and for performing the tedious parts of cabinet placement, costing, and planning. The user is freed from performing these functions and is able to focus on the esthetic aspects of the cabinet design, including cabinet placement and appearance. The computer creates an initial cabinet placement based upon constraints provided by the user, so that the user may modify an existing custom design. The user views the layout of the entire room or parts thereof at each stage of the design process on a video display terminal in three dimension, elevation, or plan views, permitting the use of computer aided design techniques. The user may make custom modifications to cabinet designs by overriding the standards or creating new standards at any point, and the changes are immediately incorporated into all aspects of design and detailing. The database includes the design constraints of the cabinetmaker, so that the cabinets as designed are capable of construction, and bidding is based upon actual costs.

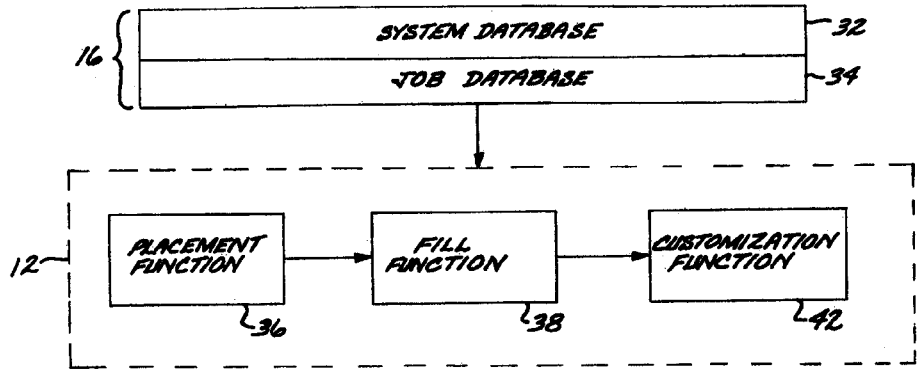

OTHER PUBLICATIONS

Compiled Door Cutting List, all pages, dated Jun. 25, 1986.
Relax, Enjoy Life, Simplify your cabinet business . . . with Complete Computer Programs & Systems by GoldenWare, Inc. Dec. 18, 1985.
Advertisements for GoldenWare, Inc., products in *Kitchen & Bath Design News*, p. 59, dated Jul. 1986.
*Wood & Wood Products*, p. 280, dated Aug. 1986.
Memorandum Decision And Order by U.S District Court Judge William B. Enright, *Cabinet Vision & Larry Cornwell v. Cabnetware*, U.S. District Court, Southern District of California, Civil No. 94–0062–E(AJB), Oct. 1, 1998.

* cited by examiner

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–19 are cancelled.

\* \* \* \* \*